United States Patent
Kyogoku et al.

(10) Patent No.: US 11,276,751 B2
(45) Date of Patent: Mar. 15, 2022

(54) SEMICONDUCTOR DEVICE, INVERTER CIRCUIT, DRIVING DEVICE, VEHICLE, AND ELEVATOR

(71) Applicant: KABUSHIKI KAISHA TOSHIBA, Minato-ku (JP)

(72) Inventors: Shinya Kyogoku, Tsukuba (JP); Toshiyuki Oshima, Bunkyo (JP); Ryosuke Iijima, Setagaya (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 7 days.

(21) Appl. No.: 16/797,037

(22) Filed: Feb. 21, 2020

(65) Prior Publication Data
US 2021/0043723 A1  Feb. 11, 2021

(30) Foreign Application Priority Data
Aug. 7, 2019 (JP) .............................. JP2019-145597

(51) Int. Cl.
*H01L 29/06* (2006.01)
*H01L 29/16* (2006.01)
(Continued)

(52) U.S. Cl.
CPC .......... *H01L 29/063* (2013.01); *H01L 21/049* (2013.01); *H01L 21/0465* (2013.01);
(Continued)

(58) Field of Classification Search
CPC ............... H01L 29/063; H01L 29/1608; H01L 29/1095; H01L 29/781; H01L 21/0465;
(Continued)

(56) References Cited

U.S. PATENT DOCUMENTS

2014/0054683 A1  2/2014  Chuang et al.
2016/0149029 A1  5/2016  Takaya et al.
(Continued)

FOREIGN PATENT DOCUMENTS

JP  2012-043993 A  3/2012
JP  2016-100466 A  5/2016
(Continued)

*Primary Examiner* — Cuong B Nguyen
(74) *Attorney, Agent, or Firm* — Oblon, McClelland, Maier & Neustadt, L.L.P.

(57) ABSTRACT

A semiconductor device of an embodiment includes a silicon carbide layer having first and second plane, the silicon carbide layer including trench having a first portion and a second portion, the second portion having a width smaller than the first portion, an n-type first silicon carbide region, a p-type second silicon carbide region between the first silicon carbide region and the first plane, a p-type third silicon carbide region between the second silicon carbide region and the first plane and having a p-type impurity concentration lower than the second silicon carbide region, an n-type fourth silicon carbide region between the third silicon carbide region and the first plane, and an n-type fifth silicon carbide region between the second portion and the second silicon carbide region and having an n-type impurity concentration higher than the first silicon carbide region; and a gate electrode in the trench.

20 Claims, 16 Drawing Sheets

(51) Int. Cl.
*H01L 29/10* (2006.01)
*H01L 29/78* (2006.01)
*H01L 21/04* (2006.01)
*H01L 29/66* (2006.01)
*B66B 11/04* (2006.01)
*H02P 27/06* (2006.01)
*B60K 1/00* (2006.01)
*B60R 16/023* (2006.01)
*B61C 3/00* (2006.01)

(52) U.S. Cl.
CPC ...... *H01L 21/0475* (2013.01); *H01L 29/1095* (2013.01); *H01L 29/1608* (2013.01); *H01L 29/66068* (2013.01); *H01L 29/7813* (2013.01); *B60K 1/00* (2013.01); *B60R 16/0231* (2013.01); *B61C 3/00* (2013.01); *B66B 11/043* (2013.01); *H02P 27/06* (2013.01)

(58) Field of Classification Search
CPC ........... H01L 21/0475; H01L 29/66068; H01L 21/049; H01L 29/0886; H01L 29/0878; H01L 21/047; H01L 29/42376; H01L 29/0696; B66B 11/043; B66B 1/308; H02P 27/06; B60K 1/00; B60R 16/0231; B61C 3/00; Y02T 30/00; B61B 1/00
See application file for complete search history.

(56) References Cited

U.S. PATENT DOCUMENTS

| | | |
|---|---|---|
| 2017/0092758 A1 | 3/2017 | Ueno |
| 2017/0141223 A1 | 5/2017 | Hoshi |
| 2018/0097079 A1 | 4/2018 | Utsumi et al. |
| 2018/0122894 A1 | 5/2018 | Kyogoku et al. |
| 2019/0181261 A1* | 6/2019 | Okumura ............... H01L 29/45 |
| 2021/0217724 A1* | 7/2021 | Matsui ................ H01L 23/3121 |

FOREIGN PATENT DOCUMENTS

| | | |
|---|---|---|
| JP | 6032337 B1 | 11/2016 |
| JP | 2017-092368 A | 5/2017 |
| JP | 2018-060923 A | 4/2018 |
| JP | 2018-074013 A | 5/2018 |

* cited by examiner

006# SEMICONDUCTOR DEVICE, INVERTER CIRCUIT, DRIVING DEVICE, VEHICLE, AND ELEVATOR

CROSS-REFERENCE TO RELATED APPLICATION

This application is based upon and claims the benefit of priority from Japanese Patent Application No. 2019-145597, filed on Aug. 7, 2019, the entire contents of which are incorporated herein by reference.

FIELD

Embodiments described herein relate generally to a semiconductor device, an inverter circuit, a drive device, a vehicle, and an elevator.

BACKGROUND

As a material for next-generation semiconductor devices, silicon carbide (SiC) has been expected. Silicon carbide has excellent physical properties such as a band gap of about 3 times, a breakdown field strength of about 10 times, and a thermal conductivity of about 3 times those of silicon. By utilizing these physical properties, it is possible to achieve a semiconductor device capable of operating at a high temperature with low loss.

In a vertical metal oxide semiconductor field effect transistor (MOSFET), a trench gate structure where a gate electrode is provided in a trench is applied so as to achieve a low on-resistance. By applying the trench gate structure, a channel area per unit area is increased and the on-resistance (RonA) is reduced.

DETAILED DESCRIPTION

Figure 1:
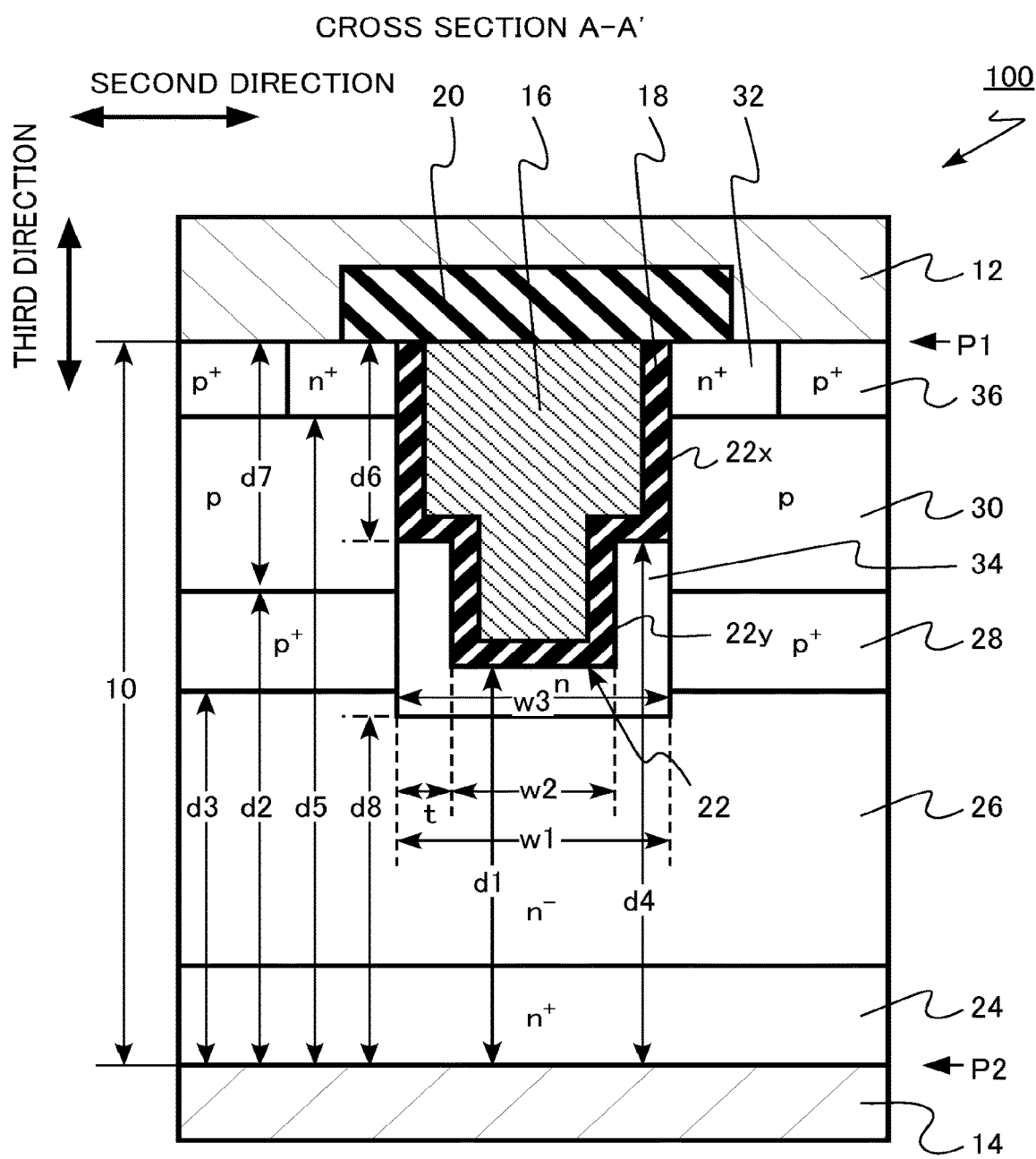
FIG. 1 is a schematic sectional view of a semiconductor device of a first embodiment.

A semiconductor device of an embodiment includes: a first electrode; a first electrode; a second electrode; a silicon carbide layer located between the first electrode and the second electrode, the silicon carbide layer having a first plane parallel to a first direction and a second direction intersecting the first direction, and a second plane parallel to the first direction and the second direction, the second plane facing the first plane, the silicon carbide layer including a trench located on a first plane side, the trench extending in the first direction on the first plane, the trench having a first portion and a second portion closer to the second plane than the first portion, the second portion having a width in the second direction smaller than a width of the first portion in the second direction, a first silicon carbide region of n-type, a second silicon carbide region of p-type located between the first silicon carbide region and the first plane, a third silicon carbide region of p-type located between the second silicon carbide region and the first plane, the third silicon carbide region having a p-type impurity concentration lower than a p-type impurity concentration of the second silicon carbide region, an fourth silicon carbide region of n-type located between the third silicon carbide region and the first plane, and an fifth silicon carbide region of n-type located between the second portion and the second silicon carbide region, the fifth silicon carbide region having an n-type impurity concentration higher than an n-type impurity concentration of the first silicon carbide region; a gate electrode located in the trench; and a gate insulating layer located between the gate electrode and the silicon carbide layer.

Hereinafter, embodiments of the present disclosure will be described with reference to the drawings. In the following description, the same or similar members are denoted by the same reference numeral, and the description of the member or the like once described may be omitted as appropriate.

In the following description, when notations of n', n, n⁻, p⁺, p, and p⁻ are used, each of these notations represents the relative level of the impurity concentration in each conductivity type. That is, $n^+$ indicates that the n-type impurity concentration is relatively higher than n, and $n^-$ indicates that the n-type impurity concentration is relatively lower than n. Further, $p^+$ indicates that the p-type impurity concentration is relatively higher than p, and $p^-$ indicates that the p-type impurity concentration is relatively lower than p. In some cases, $n^+$ type and $n^-$ type are simply referred to as n types, and $p^+$ type and $p^-$ type are simply referred to as simply p types.

The impurity concentration can be measured with a secondary ion mass spectrometry (SIMS), for example. Further, the relative level of the impurity concentration can be determined from the level of a carrier concentration obtained by scanning capacitance microscopy (SCM), for example. The distance in width, depth, or the like of an impurity region can be obtained by SIMS, for example. Also, the distance in width, depth, or the like of an impurity region can be obtained from an SCM image, for example.

The depth of the trench, the thickness of the insulating layer, and the like can be measured by an image of SIMS or a transmission electron microscope (TEM), for example.

Further, in the present specification, the impurity concentration of the silicon carbide region is to be represented by, for example, the maximum impurity concentration in a portion away from the boundary between the region and the other region.

First Embodiment

A semiconductor device of a first embodiment includes: a first electrode; a second electrode; a silicon carbide layer located between the first electrode and the second electrode, the silicon carbide layer having a first plane parallel to a first direction and a second direction intersecting the first direction, and a second plane parallel to the first direction and the second direction, the second plane facing the first plane, the silicon carbide layer including a trench located on a first plane side, the trench extending in the first direction on the first plane, the trench having a first portion and a second portion closer to the second plane than the first portion, the second portion having a width in the second direction smaller than a width of the first portion in the second direction, a first silicon carbide region of n-type, a second silicon carbide region of p-type located between the first silicon carbide region and the first plane, a third silicon carbide region of p-type located between the second silicon carbide region and the first plane, the third silicon carbide region having a p-type impurity concentration lower than a p-type impurity concentration of the second silicon carbide region, an fourth silicon carbide region of n-type located between the third silicon carbide region and the first plane, and an fifth silicon carbide region of n-type located between the second portion and the second silicon carbide region, the fifth silicon carbide region having an n-type impurity concentration higher than an n-type impurity concentration of the first silicon carbide region; a gate electrode located in the trench; and a gate insulating layer located between the gate electrode and the silicon carbide layer.

The semiconductor device of the first embodiment is a vertical MOSFET 100 using silicon carbide. The MOSFET 100 is a MOSFET having a trench gate structure where a gate electrode is provided in a trench. The MOSFET 100 is an re-channel MOSFET using electrons as carriers.

Figure 2:
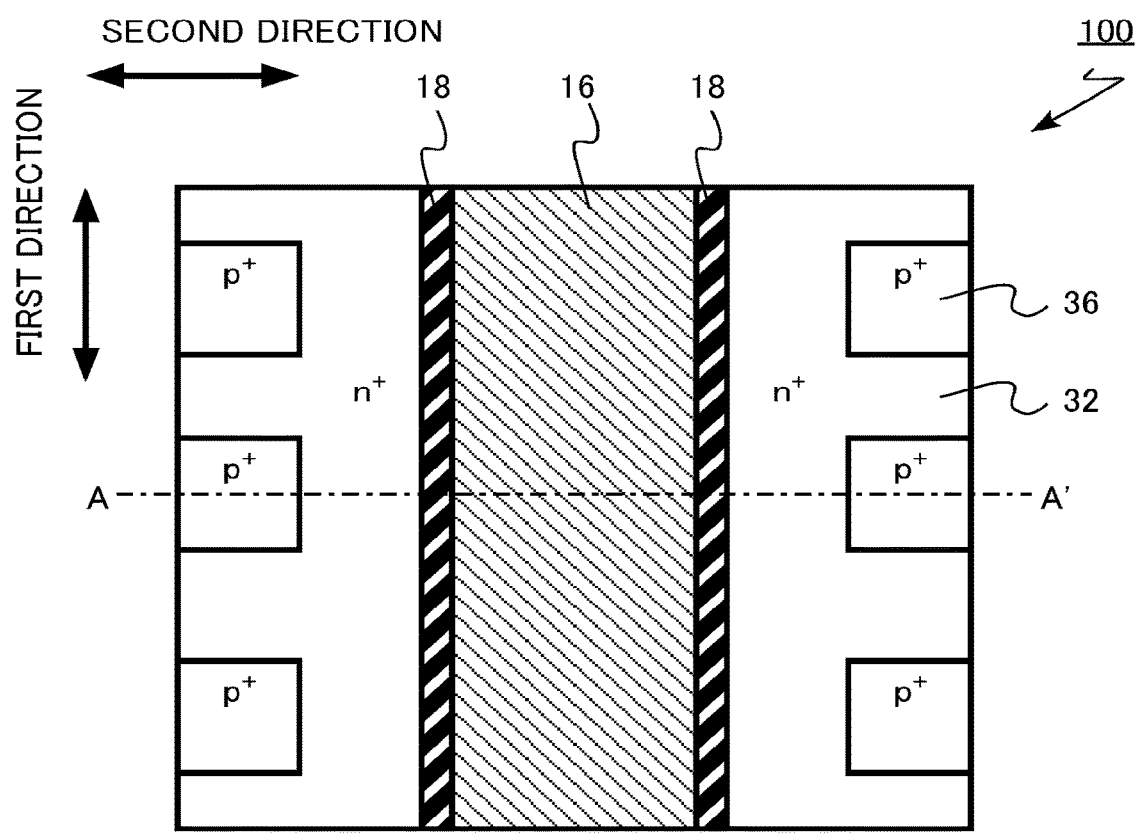
FIG. 2 is a schematic plan view of the semiconductor device according to the first embodiment.

FIG. 1 is a schematic sectional view of the semiconductor device according to the first embodiment. FIG. 2 is a schematic plan view of the semiconductor device according to the first embodiment. FIG. 1 is a sectional view taken along line AA' of FIG. 2.

The MOSFET 100 includes a silicon carbide layer 10, a source electrode 12 (first electrode), a drain electrode 14 (second electrode), a gate electrode 16, a gate insulating layer 18, and an interlayer insulating layer 20.

The silicon carbide layer 10 includes a trench 22, an n$^+$-type drain region 24, an n$^-$-type drift region 26 (first silicon carbide region), a p$^+$-type electric field relaxation region 28 (second silicon carbide region), a p-type body region 30 (third silicon carbide region), an n$^+$-type source region 32 (fourth silicon carbide region), an n-type first n-type region 34 (fifth silicon carbide region), and a p$^+$-type contact region 36 (seventh silicon carbide region).

The trench 22 has a first portion 22x and a second portion 22y.

The silicon carbide layer 10 is located between the source electrode 12 and the drain electrode 14. The silicon carbide layer 10 includes a first plane ("P1" in FIG. 1) and a second plane ("P2" in FIG. 1). Hereinafter, the first plane P1 is also referred to as a front surface, and the second plane P2 is also referred to as a back surface. The second plane P2 faces the first plane P1.

A first direction and a second direction are directions parallel to the first plane P1. The second direction is a direction that intersects the first direction. The second direction is, for example, a direction perpendicular to the first direction. A third direction is a direction perpendicular to the first plane. The third direction is a direction perpendicular to the first direction and the second direction.

Hereinafter, "depth" means a depth with the first plane P1 as a reference.

The silicon carbide layer 10 is single crystal SiC. The silicon carbide layer 10 is, for example, 4H—SiC. The thickness of the silicon carbide layer 10 is, for example, 5 μm or more and 500 μm or less.

The first plane P1 is, for example, a surface tilted from 0 degrees to 8 degrees with respect to the (0001) plane. That is, the first plane P1 is a surface with its normal inclined from 0 degrees to 8 degrees with respect to the c-axis in the [0001] direction. In other words, an off-angle with respect to the (0001) plane is 0 degrees or more and 8 degrees or less. Further, the second plane P2 is, for example, a surface inclined at an angle of 0 degrees or more and 8 degrees or less with respect to the (000-1) plane.

The (0001) plane is called a silicon face. The (000-1) plane is called a carbon face. The inclination direction of each of the first plane P1 and the second plane P2 is, for example, the [11-20] direction. The [11-20] direction is the a-axis direction. In FIG. 1, for example, the second direction illustrated in the figure is the a-axis direction.

The trench 22 is located in the silicon carbide layer 10. The trench 22 is located on the first plane P1 side of the silicon carbide layer 10. The trench 22 is a groove formed in the silicon carbide layer 10.

As illustrated in FIG. 2, the trench 22 extends in the first direction on the first plane. For example, the trench 22 is repeatedly disposed at constant pitches in the second direction.

The repetition pitch of the trench 22 in the second direction is, for example, 1 μm or more and 5 μm or less. The depth of the trench 22 is, for example, 1 μm or more and 2 μm or less.

In the MOSFET 100, for example, the structure illustrated in FIG. 1 becomes one unit. For example, each of a plurality of units is repeatedly disposed at constant pitches in the second direction.

The trench 22 has a first portion 22x and a second portion 22y. The second portion 22y is closer to the second plane P2 than the first portion. The first portion 22x is an upper portion of the trench 22, and the second portion 22y is a lower portion of the trench 22. There is a step between the first portion 22x and the second portion 22y.

The width in the second direction (w2 in FIG. 1) of the second portion 22y is smaller than the width in the second direction (w1 in FIG. 1) of the first portion 22x. The width w2 of the second portion 22y is, for example, 0.5 or more times and 0.95 or less times the width w1 of the first portion 22x.

The width w1 of the first portion 22x is, for example, 0.5 μm or more and 2 μm or less. The difference between the width w1 of the first portion 22x and the width w2 of the second portion 22y is, for example, 0.02 µm or more and 0.4 µm or less.

The trench 22 penetrates the source region 32. The trench 22 penetrates the body region 30.

The distance from the second plane P2 to the trench 22 (d1 in FIG. 1) is shorter than, for example, the distance from the second plane P2 to the body region 30 (d2 in FIG. 1). In other words, the depth of the trench 22 is greater than the depth of the body region 30.

The distance from the second plane P2 to the trench 22 (d1 in FIG. 1) is longer than, for example, the distance from the second plane P2 to the electric field relaxation region 28 (d3 in FIG. 1). In other words, the depth of the trench 22 is smaller than the depth of the electric field relaxation region 28.

The distance from the second plane P2 to the first portion 22x of the trench 22 (d4 in FIG. 1) is longer than, for example, the distance from the second plane P2 to the body region 30 (d2 in FIG. 1). In other words, the depth of the first portion 22x is smaller than the depth of the body region 30.

The distance from the second plane P2 to the first portion 22x of the trench 22 (d4 in FIG. 1) is shorter than, for example, the distance from the second plane P2 to the source region 32 (d5 in FIG. 1). In other words, the depth of the first portion 22x is greater than the depth of the source region 32.

The gate electrode 16 is located in the trench 22. The gate electrode 16 is provided between the source electrode 12 and the drain electrode 14. The gate electrode 16 extends in the first direction on the first plane.

The gate electrode 16 is a conductive layer. The gate electrode 16 is, for example, polycrystalline silicon containing p-type impurities or n-type impurities.

The gate insulating layer 18 is located between the gate electrode 16 and the silicon carbide layer 10. The gate insulating layer 18 is provided between the gate electrode 16 and the source region 32, the body region 30, as well as the first n-type region 34.

The gate insulating layer 18 is a silicon oxide film, for example. To the gate insulating layer 18, for example, a High-k insulating film (high dielectric constant insulating film such as HfSiON, ZrSiON, AlON) is applicable. To the gate insulating layer 18, for example, a stacked film of a silicon oxide film ($SiO_2$) and a High-k insulating film is also applicable.

The interlayer insulating layer 20 is provided on the gate electrode 16. The interlayer insulating layer 20 is provided between the gate electrode 16 and the source electrode 12. The thickness of the interlayer insulating layer 20 is greater than, for example, the thickness of the gate insulating layer 18. The interlayer insulating layer 20 is, for example, a silicon oxide film. The interlayer insulating layer 20 electrically separates the gate electrode 16 and the source electrode 12.

The source electrode 12 is located on the first plane P1 side of the silicon carbide layer 10. The source electrode 12 is provided on the first plane P1 of the silicon carbide layer 10. The source electrode 12 is in contact with the source region 32 and the contact region 36.

The source electrode 12 includes metal. The metal forming the source electrode 12 has, for example, a stacked structure of titanium (Ti) and aluminum (Al). The source electrode 12 may include metal silicide or metal carbide in contact with silicon carbide layer 10.

The drain electrode 14 is located on the second plane P2 side of the silicon carbide layer 10. The drain electrode 14 is provided on the second plane P2 of the silicon carbide layer 10. The drain electrode 14 is in contact with the drain region 24.

The drain electrode 14 is, for example, metal or a metal semiconductor compound. The drain electrode 14 includes, for example, a material selected from the group consisting of nickel silicide (NiSi), titanium (Ti), nickel (Ni), silver (Ag), and gold (Au).

The $n^+$-type drain region 24 is provided on the second plane P2 side of the silicon carbide layer 10. The drain region 24 includes, for example, nitrogen (N) as n-type impurities. The n-type impurity concentration in the drain region 24 is, for example, $1\times10^{18}$ $cm^{-3}$ or more and $1\times10^{21}$ $cm^{3}$ or less.

The $n^-$-type drift region 26 is provided on the drain region 24. The drift region 26 is located between the first plane P1 and the drain region 24.

The drift region 26 includes, for example, nitrogen (N) as n-type impurities. The impurity concentration of the n-type impurities in the drift region 26 is, for example, $4\times10^{14}$ $cm^{-3}$ or more and $1\times10^{18}$ $cm^{-3}$ or less.

The $p^+$-type electric field relaxation region 28 is located between the drift region 26 and the first plane P1. The electric field relaxation region 28 is located between the drift region 26 and the body region 30.

The electric field relaxation region 28 has a function of relaxing an electric field that is applied to the gate insulating layer 18 when the MOSFET 100 is turned off. The electric field relaxation region 28 is fixed to the same potential as the source electrode 12, for example.

The electric field relaxation region 28 includes, for example, aluminum (Al) as p-type impurities. The p-type impurity concentration in the electric field relaxation region 28 is higher than the p-type impurity concentration in the body region 30. The p-type impurity concentration of the electric field relaxation region 28 is, for example, 10 times or more and 100 times or less the p-type impurity concentration of the body region 30. The p-type impurity concentration of the electric field relaxation region 28 is, for example, $1\times10^{17}$ $cm^{-3}$ or more and $1\times10^{20}$ $cm^{-3}$ or less. The p-type impurity concentration of the electric field relaxation region 28 is, for example, $1\times10^{10}$ $cm^{-3}$ or more.

The depth of the electric field relaxation region 28 is greater than the depth of the trench 22. The depth of the electric field relaxation region 28 is, for example, 0.4 µm or more and 2.0 µm or less.

The p-type body region 30 is located between the electric field relaxation region 28 and the first plane P1. The body region 30 is located between the electric field relaxation region 28 and the source region 32.

The body region 30 functions as a channel region of the MOSFET 100. For example, when the MOSFET 100 is turned on, a channel through which electrons flow is formed in a region of the body region 30 in contact with the gate insulating layer 18. The region of the body region 30 in contact with the gate insulating layer 18 is a channel formation region.

The body region 30 includes, for example, aluminum (Al) as p-type impurities. The impurity concentration of the p-type impurities in the body region 30 is, for example, $5\times10^{16}$ $cm^{-3}$ or more and $5\times10^{17}$ $cm^{-3}$ or less.

The depth of the body region 30 is smaller than the depth of the trench 22. The depth of the body region 30 is, for example, 0.2 µm or more and 1.0 µm or less.

The $n^+$-type source region 32 is located between the body region 30 and the first plane P1. The source region 32 is in contact with the source electrode 12. The source region 32 is in contact with the gate insulating layer 18.

The source region 32 includes, for example, phosphorus (P) as n-type impurities. The n-type impurity concentration of the source region 32 is higher than the n-type impurity concentration of the drift region 26. The n-type impurity concentration of the source region 32 is, for example, $1\times10^{19}$ cm$^{-3}$ or more and $1\times10^{21}$ cm$^{-3}$ or less.

The depth of the source region 32 is smaller than the depth of the body region 30. The depth of the source region 32 is, for example, 0.1 μm or more and 0.3 μm or less.

The p$^+$-type contact region 36 is located between the body region 30 and the first plane P1. The contact region 36 is adjacent to the source region 32. The contact region 36 is in contact with the source electrode 12.

The p$^+$-type contact region 36 has a function of reducing the contact resistance between the source electrode 12 and the silicon carbide layer 10.

As illustrated in FIG. 2, for example, the contact region 36 is repeatedly disposed in the first direction on the first plane P1 with the source region 32 interposed between the contact regions 36.

The contact region 36 includes, for example, aluminum (Al) as p-type impurities. The contact region 36 has a p-type impurity concentration higher than the p-type impurity concentration of the body region 30. The p-type impurity concentration of the contact region 36 is, for example, $1\times10^{19}$ cm$^{-3}$ or more and $1\times10^{21}$ cm$^{-3}$ or less.

The depth of the contact region 36 is, for example, 0.1 μm or more and 0.3 μm or less.

The n-type first n-type region 34 is located between the second portion 22y of the trench 22 and the electric field relaxation region 28. The first n-type region 34 is located between the second portion 22y of the trench 22 and the body region 30. The first n-type region 34 is located between the trench 22 and the drift region 26. The first n-type region 34 is provided so as to cover the second portion 22y of the trench 22.

The first n-type region 34 is in contact with the side surface and the bottom surface of the second portion 22y. The first n-type region 34 is in contact with the gate insulating layer 18.

The first n-type region 34 functions as a path for allowing electrons to flow from the channel formed in the body region 30 to the drift region 26 when the MOSFET 100 is turned on.

The n-type impurity concentration of the first n-type region 34 is higher than the p-type impurity concentration of the first n-type region 34.

The first n-type region 34 includes, for example, nitrogen (N) as n-type impurities. The n-type impurity concentration of the first n-type region 34 is higher than the n-type impurity concentration of the drift region 26. The n-type impurity concentration of the first n-type region 34 is, for example, $2\times10^{17}$ cm$^{-3}$ or more and $2\times10^{20}$ cm$^{-3}$ or less. The n-type impurity concentration of the first n-type region 34 is, for example, $1\times10^{17}$ cm$^{-3}$ or more. The n-type impurity concentration of the first n-type region 34 is, for example, $1\times10^{18}$ cm$^{-3}$ or more.

The first n-type region 34 includes, for example, aluminum (Al) as p-type impurities. The p-type impurity concentration of the first n-type region 34 is higher than, for example, the p-type impurity concentration of the body region 30. The p-type impurity concentration of the first n-type region 34 is, for example, $1\times10^{17}$ cm$^{-3}$ or more and $1\times10^{20}$ cm$^{-3}$ or less. The p-type impurity concentration of the first n-type region 34 is, for example, $1\times10^{10}$ cm$^{-3}$ or more.

The thickness of the first n-type region 34 in the second direction (t in FIG. 1) is, for example, 0.01 μm or more and 0.2 μm or less.

The width in the second direction (w3 in FIG. 1) of the first n-type region 34 is, for example, 0.8 times or more and 1.5 times or less the width in the second direction (w1 in FIG. 1) of the first portion 22x of the trench 22.

The distance from the first plane P1 to the first n-type region 34 (d6 in FIG. 1) is shorter than, for example, the distance from the first plane P1 to the electric field relaxation region 28 (d7 in FIG. 1). Further, the distance from the second plane P2 to the first n-type region 34 (d8 in FIG. 1) is shorter than, for example, the distance from the second plane P2 to the electric field relaxation region 28 (d3 in FIG. 1).

Next, an example of a method for manufacturing the semiconductor device of the first embodiment will be described.

FIG. 3, FIG. 4, FIG. 5, FIG. 6, FIG. 7, FIG. 8, and FIG. 9 are schematic sectional views illustrating an example of the method for manufacturing the semiconductor device of the first embodiment. FIG. 3, FIG. 4, FIG. 5, FIG. 6, FIG. 7, FIG. 8, and FIG. 9 illustrate cross sections corresponding to FIG. 1.

First, the silicon carbide layer 10 having an n$^+$-type drain region 24 and an n$^-$-type epitaxial layer formed by epitaxial growth on the drain region 24 is prepared. A part of the epitaxial layer finally becomes the drift region 26.

Figure 3:
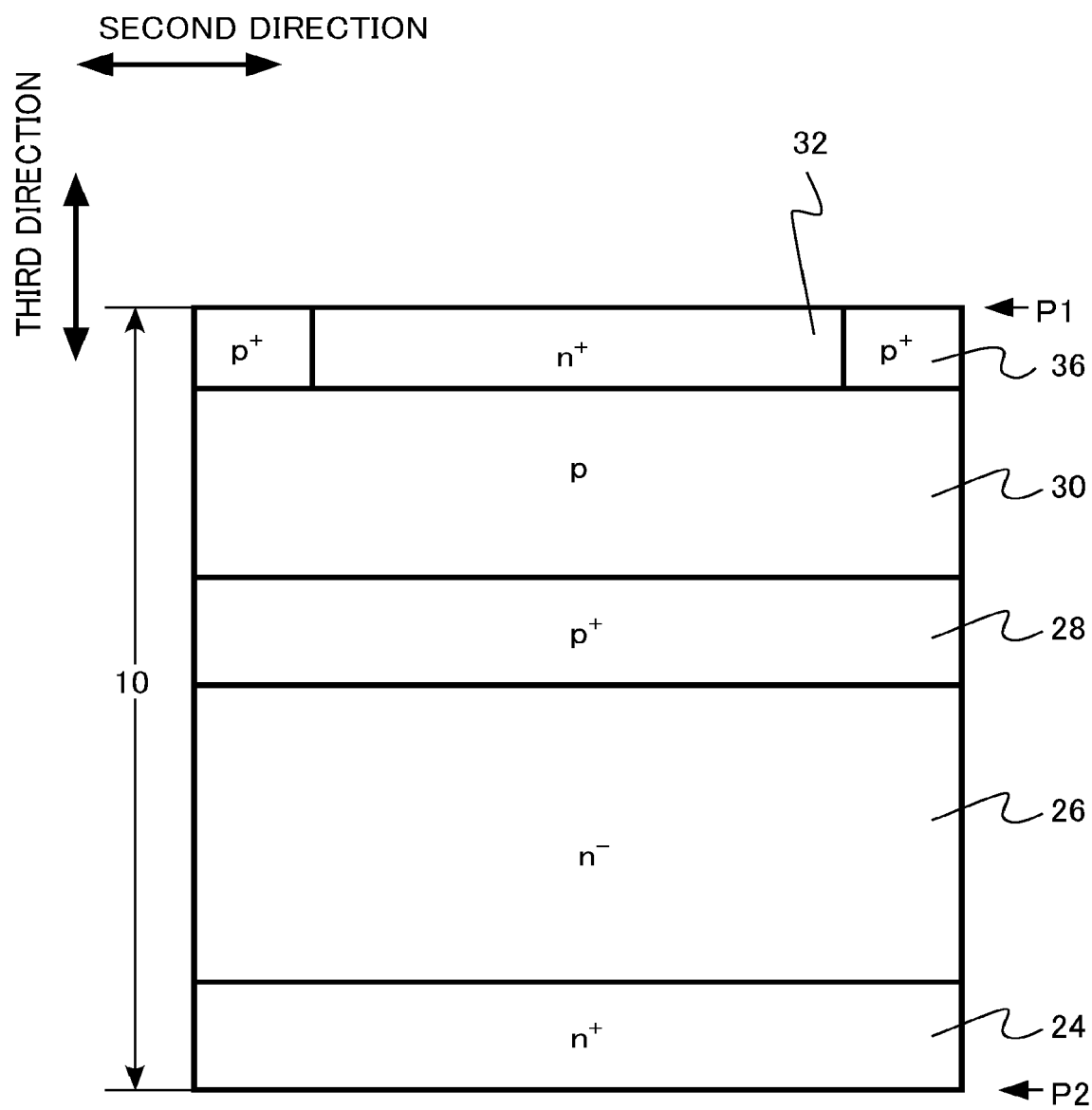
FIG. 3 is a schematic sectional view illustrating an example of a method for manufacturing the semiconductor device according to the first embodiment.

Next, the p$^+$-type electric field relaxation region 28, the p-type body region 30, the n$^+$-type source region 32, and the p$^+$-type contact region 36 are formed on the epitaxial layer by using, for example, a known lithography method and ion implantation method (FIG. 3).

Subsequently, a mask material 50 is formed on the front surface of the silicon carbide layer 10 by using a known process technique. The mask material 50 is, for example, a silicon oxide film.

Figure 4:
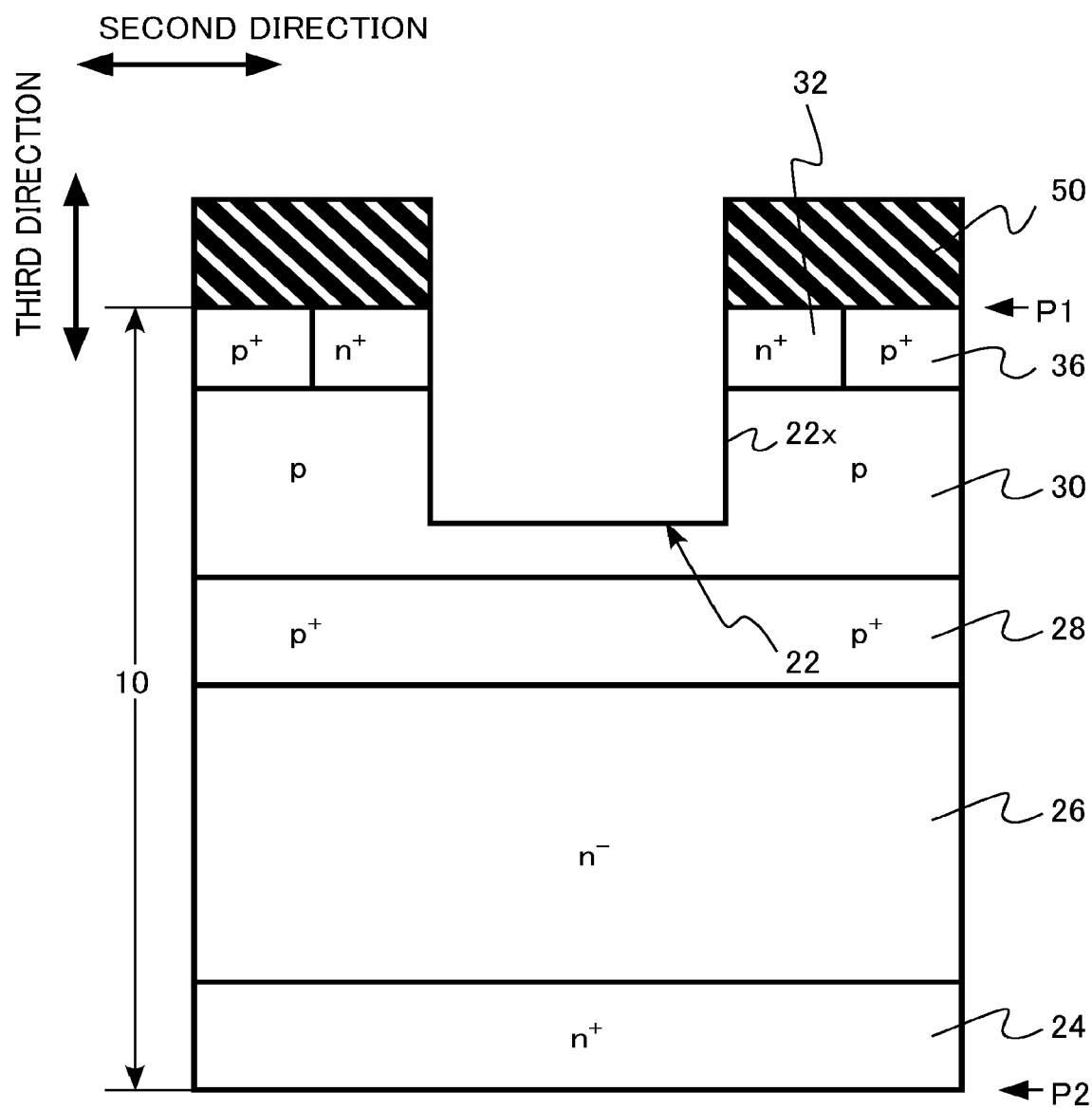
FIG. 4 is a schematic sectional view illustrating an example of the method for manufacturing the semiconductor device according to the first embodiment.

Then, the first portion 22x of the trench 22 is formed using a known reactive ion etching method, with the mask material 50 as a mask (FIG. 4). The first portion 22x is formed so as to penetrate the source region 32. The first portion 22x is formed so as not to reach the electric field relaxation region 28.

Figure 5:
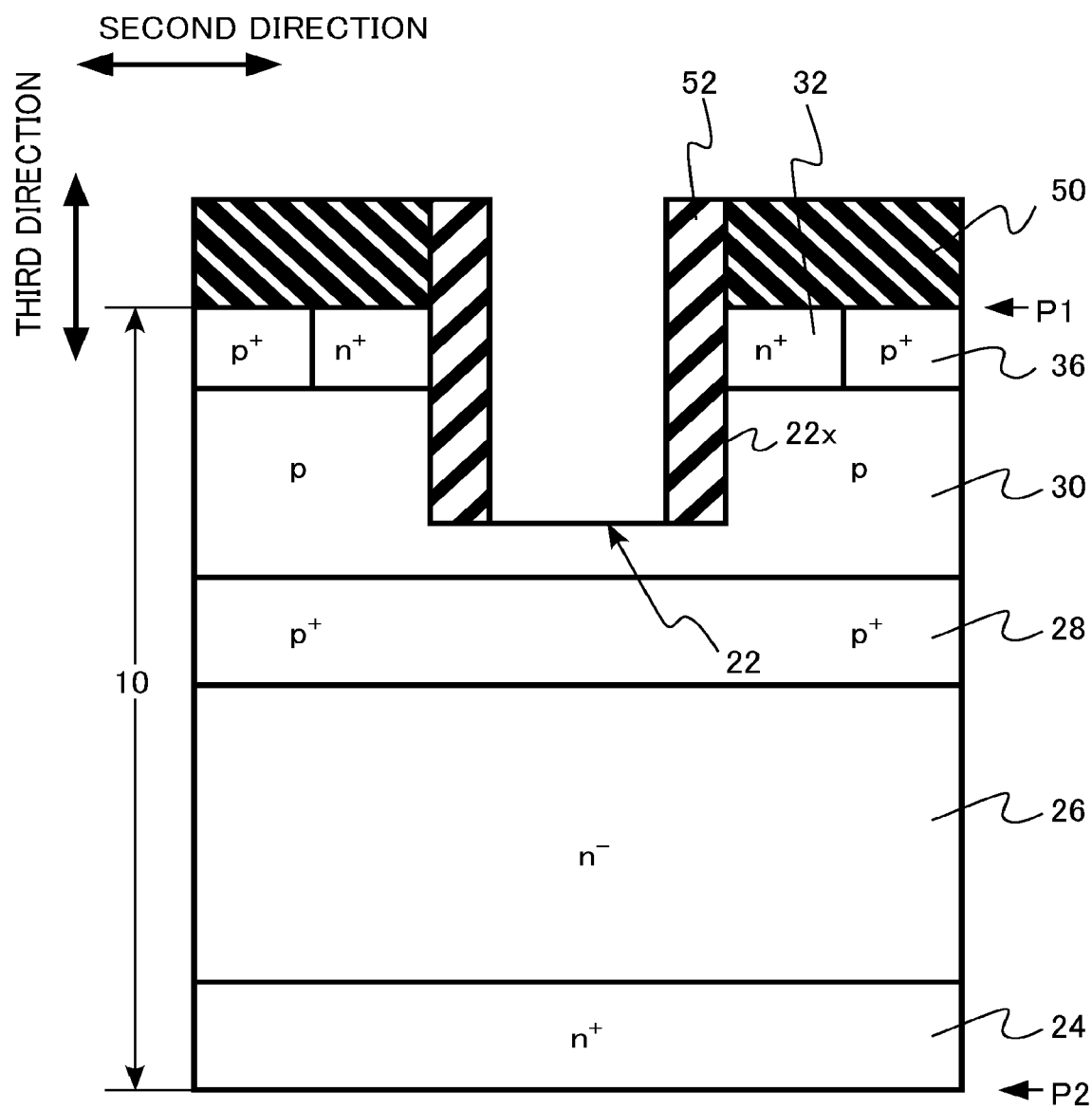
FIG. 5 is a schematic sectional view illustrating an example of the method for manufacturing the semiconductor device according to the first embodiment.

Next, a sidewall insulating film 52 is formed on the side surface of the trench 22 (FIG. 5). The sidewall insulating film 52 is formed using, for example, a known film deposition method and reactive ion etching method. The sidewall insulating film 52 is, for example, a silicon oxide film.

Figure 6:
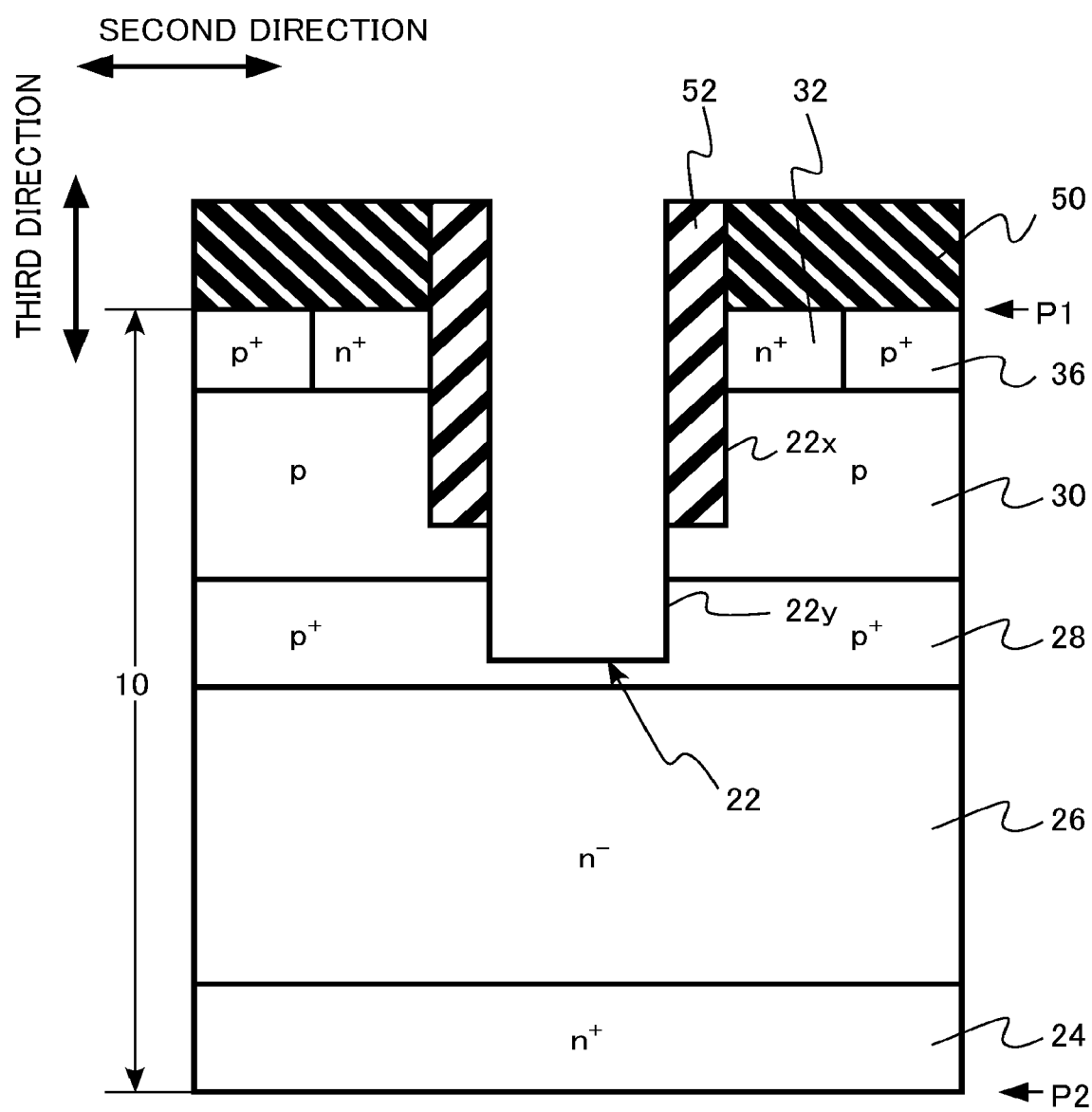
FIG. 6 is a schematic sectional view illustrating an example of the method for manufacturing the semiconductor device according to the first embodiment.

Subsequently, a second portion 22y of the trench 22 is formed using a known reactive ion etching method, with the mask material 50 and the sidewall insulating film 52 as a mask (FIG. 6). The second portion 22y is formed so as to penetrate body region 30. The first portion 22x is formed so as not to reach the drift region 26.

Figure 7:
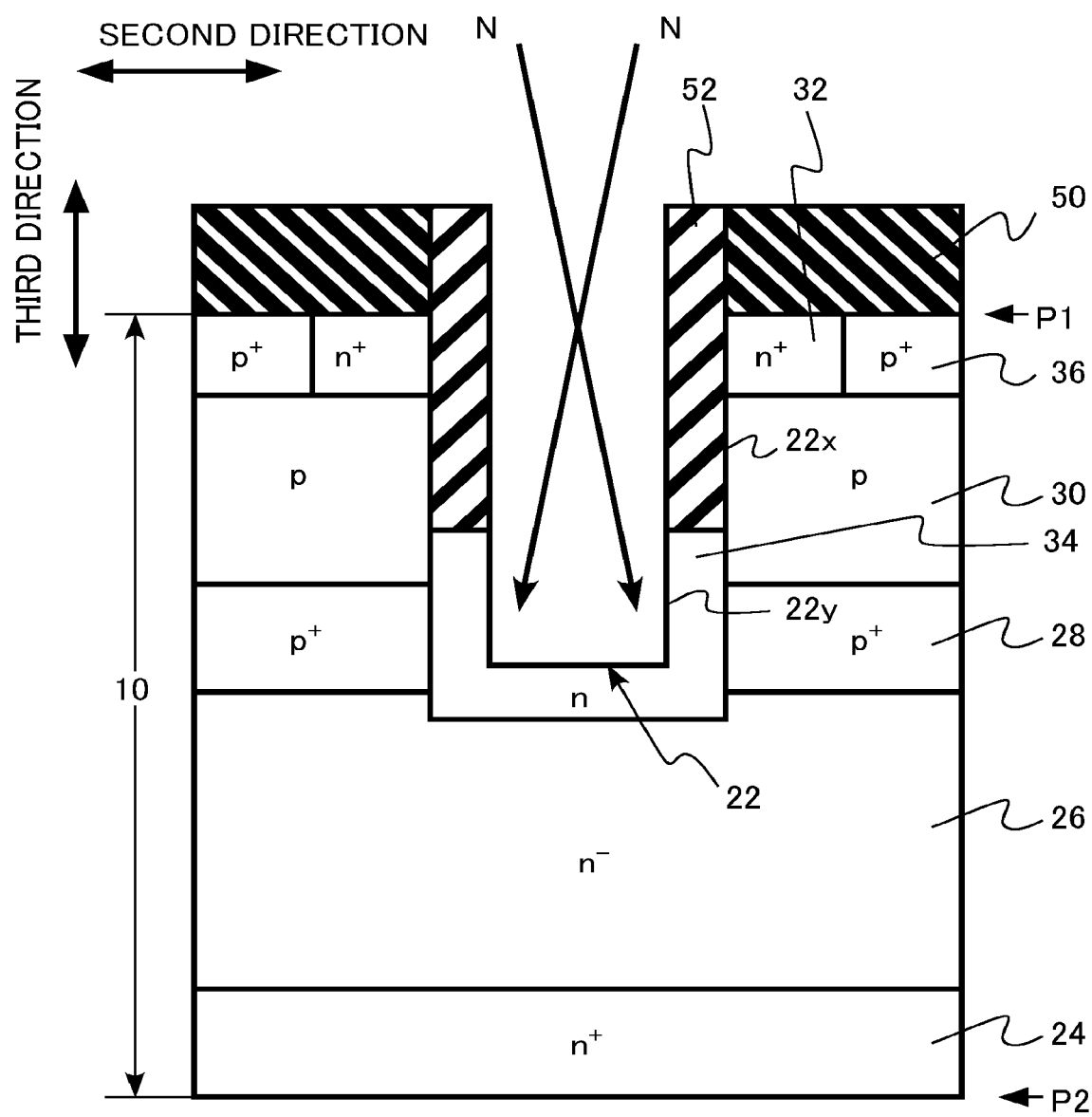
FIG. 7 is a schematic sectional view illustrating an example of the method for manufacturing the semiconductor device according to the first embodiment.

Then, n-type impurities are implanted using an oblique ion implantation method, with the mask material 50 and the sidewall insulating film 52 as a mask, to form a first n-type region 34 (FIG. 7). The n-type impurities are implanted on an ion implantation condition in which the n-type impurity concentration is higher than the p-type impurity concentration in the electric field relaxation region 28. The n-type impurities are, for example, nitrogen (N).

The first n-type region 34 is formed on the side surface and the bottom surface of the second portion 22y of the trench 22. The first n-type region 34 is formed so as to cover the second portion 22y.

Figure 8:
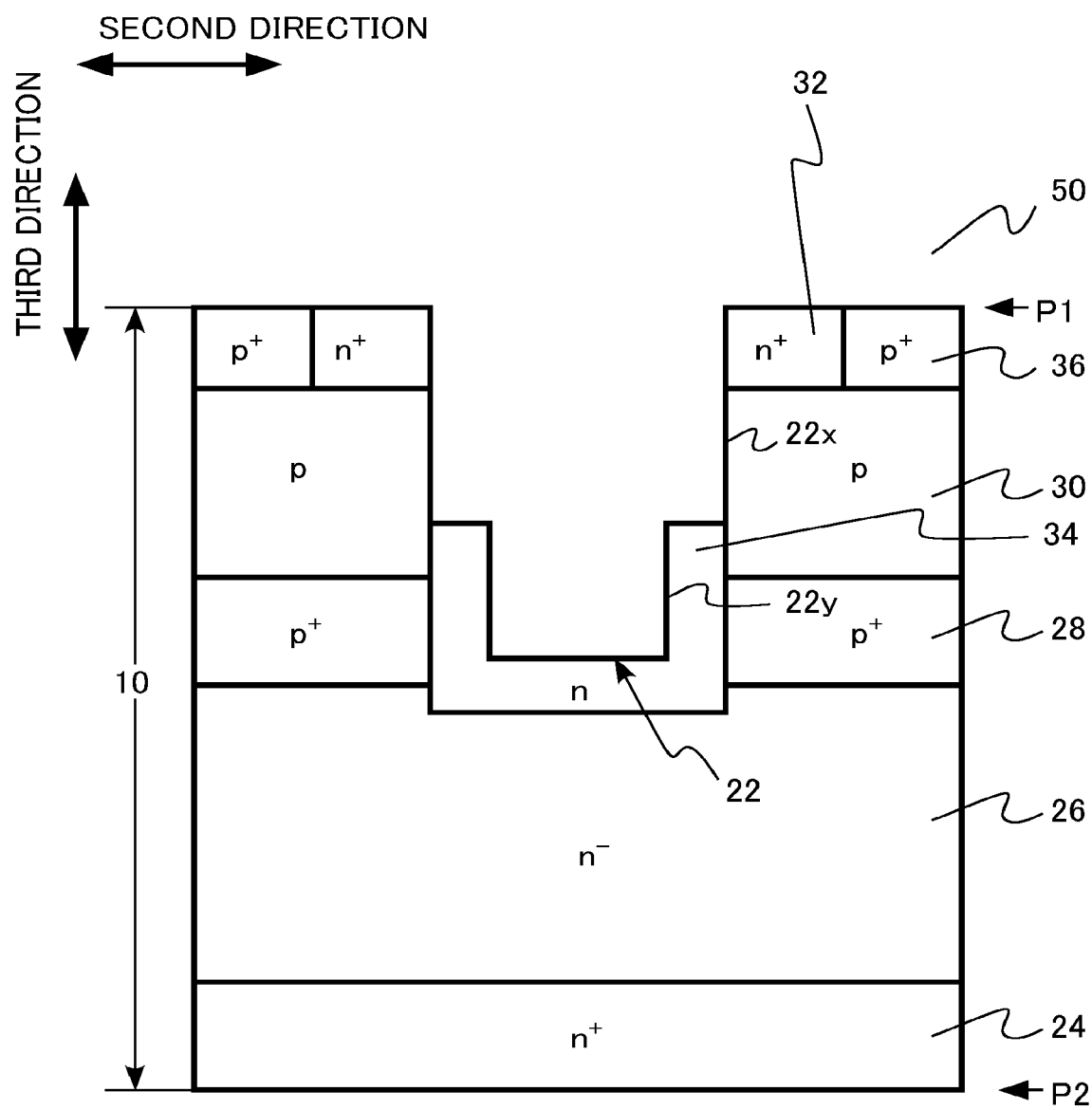
FIG. 8 is a schematic sectional view illustrating an example of the method for manufacturing the semiconductor device according to the first embodiment.

Next, the mask material 50 and the sidewall insulating film 52 are removed by, for example, a known wet etching method (FIG. 8).

Figure 9:
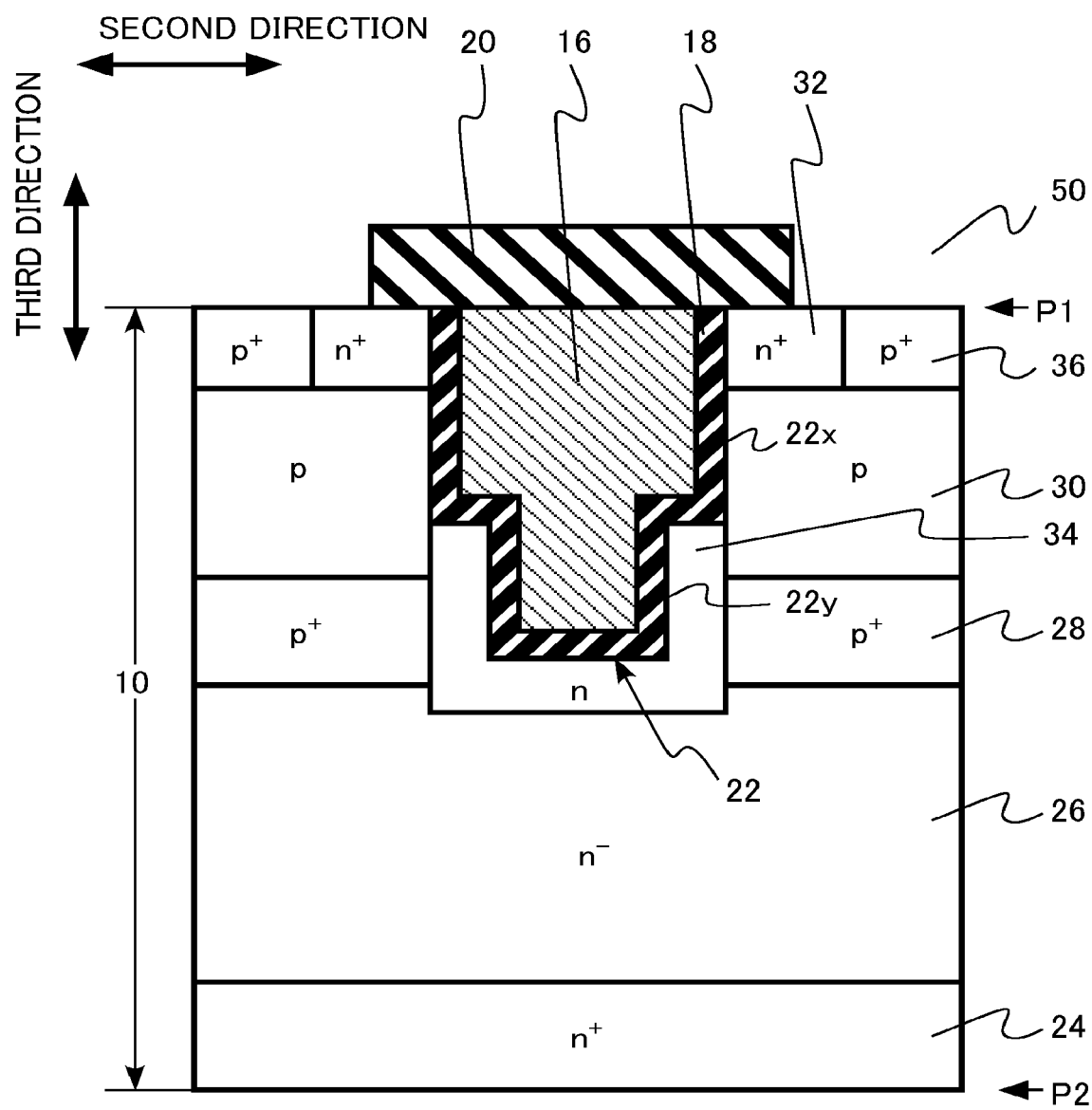
FIG. 9 is a schematic sectional view illustrating an example of the method for manufacturing the semiconductor device according to the first embodiment.

Subsequently, the gate insulating layer 18 and the gate electrode 16 are formed in the trench 22 by using a known process technique. Further, an interlayer insulating layer 20 is formed on the gate electrode 16 by using a known process technique (FIG. 9).

Thereafter, the source electrode 12 and the drain electrode 14 are formed using a known process technique. The MOSFET 100 illustrated in FIG. 1 is manufactured by the above manufacturing method.

Next, the functions and effects of the semiconductor device of the first embodiment will be described.

The MOSFET 100 employs a trench gate structure where the gate electrode 16 is provided in the trench 22. By applying the trench gate structure, the channel area per unit area is increased and the on-resistance of the MOSFET 100 is reduced.

In a MOSFET having a trench gate structure, there is a risk that an electric field strength increases, the electric field strength being applied to the gate insulating layer at the bottom of the trench when the MOSFET is turned off, and the reliability of the gate insulating layer is reduced. In order to reduce the electric field strength to be applied to the gate insulating layer, for example, there is a method of forming a deep p-type electric field relaxation region in the silicon carbide layer on each side of the trench. A depletion layer extending from the deep p-type electric field relaxation region reduces the electric field strength to be applied to the gate insulating layer at the bottom of the trench.

However, in order to form a deep p-type electric field relaxation region, it is necessary, for example, to form a trench for formation of a deep p-type region separately from the trench for the gate electrode, or to introduce p-type impurities from the front surface to the deep inside of a silicon carbide layer, using high acceleration ion implantation. It is necessary to form a trench for formation of a p-type region or a mask material for high acceleration ion implantation, with a margin with respect to the trench for the gate electrode. Hence, there is a problem that the unit size of the MOSFET becomes large and the on-resistance of the MOSFET increases.

The MOSFET 100 of the first embodiment has the electric field relaxation region 28, thereby reducing the electric field strength to be applied to the gate insulating layer at the bottom of the trench. This improves the reliability of the gate insulating layer. Then, after the formation of the trench 22, the first n-type region 34 is formed by ion implantation. The electric field relaxation region 28 can be formed in a self-aligned manner with respect to the trench 22. This prevents an increase in the unit size of the MOSFET 100 for forming electric field relaxation region 28. Therefore, the on-resistance of the MOSFET 100 is reduced.

Further, at the time of forming the first n-type region 34 by ion implantation of n-type impurities from the side surface of the trench 22, the channel formation region of the p-type body region 30 is covered with the sidewall insulating film 52. For this reason, n-type impurities are not introduced into the channel formation region. Therefore, the impurity concentration in the channel formation region can be kept low, to prevent a decrease in mobility of impurities caused by the scattering of the electrons due to the impurities. Therefore, the on-resistance of the MOSFET 100 is reduced.

The p-type impurity concentration of the electric field relaxation region 28 is preferably 10 times or more and 100 times or less the p-type impurity concentration of the body region 30. By the p-type impurity concentration exceeding the lower limit, the effect of reducing the electric field strength of the gate insulating layer 18, exerted by the electric field relaxation region 28, increases. By the n-type impurity concentration falling below the upper limit, the formation of the electric field relaxation region 28 is facilitated.

The width w2 of the second portion 22y of the trench 22 is preferably 0.5 times or more and 0.95 times or less the width w1 of the first portion 22x, for example. By exceeding the lower limit, the second portion 22y of the trench 22 can be easily formed. Further, the effect of reducing the electric field strength of the gate insulating layer 18, exerted by the electric field relaxation region 28, increases. By falling below the upper limit, the resistance of the first n-type region 34 is reduced, and the on-resistance of the MOSFET 100 is reduced.

The distance from the second plane P2 to the trench 22 (d1 in FIG. 1) is preferably shorter than, for example, the distance from the second plane P2 to the body region 30 (d2 in FIG. 1). In other words, the depth of the trench 22 is preferably greater than the depth of the body region 30. The resistance between the first n-type region 34 and the drift region 26 can be reduced, and the on-resistance of the MOSFET 100 is reduced.

The distance from the second plane P2 to the trench 22 (d1 in FIG. 1) is preferably longer than the distance from the second plane P2 to the electric field relaxation region 28 (d3 in FIG. 1). In other words, the depth of the trench 22 is preferably smaller than the depth of the electric field relaxation region 28. The effect of reducing the electric field strength of the gate insulating layer 18, exerted by the electric field relaxation region 28, increases.

The distance from the second plane P2 to the first portion 22x of the trench 22 (d4 in FIG. 1) is preferably longer than the distance from the second plane P2 to the body region 30 (d2 in FIG. 1). In other words, the depth of the first portion 22x is preferably smaller than the depth of the body region 30. The resistance between the channel formation region of the body region 30 and the first n-type region 34 is reduced, and the on-resistance of the MOSFET 100 is reduced.

The distance from the second plane P2 to the first portion 22x of the trench 22 (d4 in FIG. 1) is preferably shorter than the distance from the second plane P2 to the source region 32 (d5 in FIG. 1). In other words, the depth of the first portion 22x is preferably greater than the depth of the source region 32. The channel formation region can be formed in the body region 30.

The n-type impurity concentration of the first n-type region 34 is preferably $2 \times 10^{17}$ cm$^{-3}$ or more and $2 \times 10^{20}$ cm$^{-3}$ or less, and more preferably $4 \times 10^{17}$ cm$^{-3}$ or more and $2 \times 10^{18}$ cm$^{-3}$ or less. By the n-type impurity concentration exceeding the lower limit, the resistance of the first n-type region 34 is reduced, and the on-resistance of the MOSFET 100 is reduced. By the n-type impurity concentration falling below the upper limit, the formation of the first n-type region 34 is facilitated. Further, the effect of reducing the electric field strength of the gate insulating layer 18, exerted by the electric field relaxation region 28, increases.

The thickness of the first n-type region 34 in the second direction (t in FIG. 1) is preferably 0.01 μm or more and 0.2 μm or less, and more preferably 0.05 μm or more and 0.1 μm or less. By the n-type impurity concentration exceeding the lower limit, the resistance of the first n-type region 34 is reduced, and the on-resistance of the MOSFET 100 is reduced. By the thickness falling below the upper limit, the effect of reducing the electric field strength of the gate insulating layer 18, exerted by the electric field relaxation region 28, increases.

The width of the first n-type region 34 in the second direction (w3 in FIG. 1) is preferably 0.8 times or more and less than 1.5 times the width of the first portion 22x of the trench 22 in the second direction (w1 in FIG. 1). By the n-type impurity concentration exceeding the lower limit, the resistance of the first n-type region 34 is reduced, and the on-resistance of the MOSFET 100 is reduced. By the thickness falling below the upper limit, the effect of reducing the electric field strength of the gate insulating layer 18, exerted by the electric field relaxation region 28, increases.

The distance from the first plane P1 to the first n-type region 34 (d6 in FIG. 1) is preferably shorter than the distance from the first plane P1 to the electric field relaxation region 28 (d7 in FIG. 1). The resistance between the channel formation region of the body region 30 and the first n-type region 34 is reduced, and the on-resistance of the MOSFET 100 is reduced.

Further, the distance from the second plane P2 to the first n-type region 34 (d8 in FIG. 1) is preferably shorter than the distance from the second plane P2 to the electric field relaxation region 28 (d3 in FIG. 1). The resistance between the first n-type region 34 and the drift region 26 can be reduced, and the on-resistance of the MOSFET 100 is reduced.

The contact region 36 is preferably repeatedly disposed in the first direction on the first plane P1 with the source region 32 interposed between the contact regions 36. The ratio of the source region 32 to one unit of the MOSFET 100 increases, and the on-resistance of the MOSFET 100 is reduced.

As described above, according to the first embodiment, it is possible to achieve a MOSFET capable of improving the reliability of the gate insulating layer and reducing the on-resistance.

Second Embodiment

The semiconductor device of the second embodiment is different from that of the first embodiment in that, the silicon carbide layer further includes a sixth silicon carbide region located between the trench and the first silicon carbide region and has an n-type impurity concentration higher than the n-type impurity concentration of the fifth silicon carbide region. Hereinafter, a part of the description of contents overlapping with those of the first embodiment will be omitted.

The semiconductor device of the second embodiment is a vertical MOSFET 200 using silicon carbide. The MOSFET 200 is a MOSFET having a trench gate structure where a gate electrode is provided in a trench. The MOSFET 200 is an re-channel MOSFET using electrons as carriers.

Figure 10:
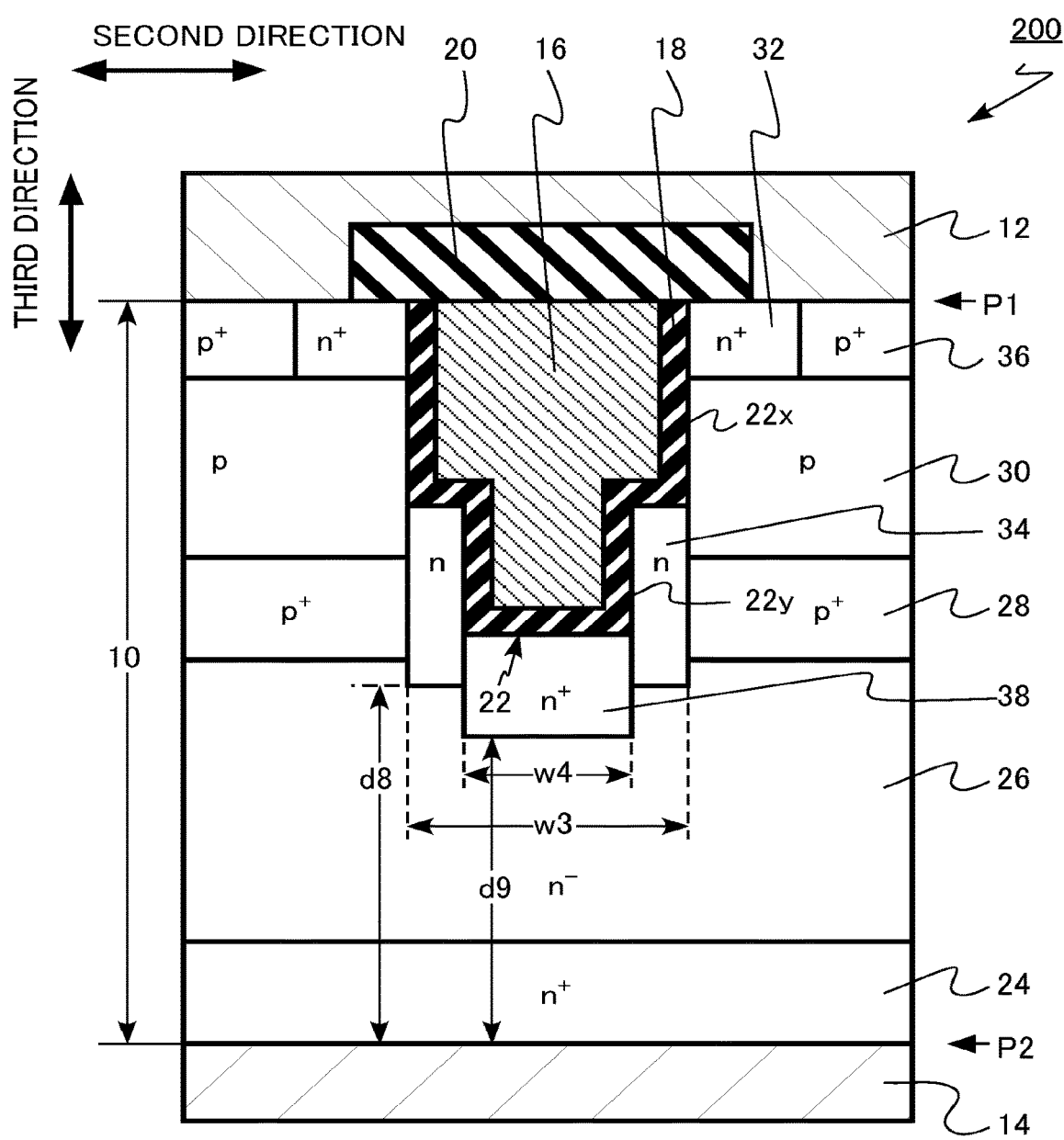
FIG. 10 is a schematic sectional view of a semiconductor device of a second embodiment.

FIG. 10 is a schematic sectional view of the semiconductor device according to the second embodiment. FIG. 10 is a sectional view corresponding to FIG. 1 of the semiconductor device according to the second embodiment.

The MOSFET 200 includes a silicon carbide layer 10, a source electrode 12 (first electrode), a drain electrode 14 (second electrode), a gate electrode 16, a gate insulating layer 18, and an interlayer insulating layer 20.

The silicon carbide layer 10 includes a trench 22, an n$^+$-type drain region 24, an n$^-$-type drift region 26 (first silicon carbide region), a p$^+$-type electric field relaxation region 28 (second silicon carbide region), a p-type body region 30 (third silicon carbide region), an n$^+$-type source region 32 (fourth silicon carbide region), an n-type first n-type region 34 (fifth silicon carbide region), a p$^+$-type contact region 36 (seventh silicon carbide region), and an n$^+$-type second n-type region 38 (sixth silicon carbide region).

The trench 22 has a first portion 22x and a second portion 22y.

The n$^+$-type second n-type region 38 is located between the trench 22 and the drift region 26. The second n-type region 38 is located between the second portion 22y of the trench 22 and the drift region 26. The second n-type region 38 is in contact with the bottom surface of the second portion 22y. The second n-type region 38 is in contact with the gate insulating layer 18.

The second n-type region 38 functions as a path for allowing electrons to flow from the channel formed in the body region 30 to the drift region 26 when the MOSFET 200 is turned on.

The second n-type region 38 includes, for example, nitrogen (N) as n-type impurities. The n-type impurity concentration of the second n-type region 38 is higher than the n-type impurity concentration of the drift region 26. The n-type impurity concentration of the second n-type region 38 is higher than the n-type impurity concentration of the first n-type region 34. The n-type impurity concentration of the second n-type region 38 is, for example, $5\times10^{10}$ cm$^{-3}$ or more and $1\times10^{21}$ cm$^{-3}$ or less.

The width of the second n-type region 38 in the second direction (w4 in FIG. 10) is smaller than the width of the first n-type region 34 in the second direction (w3 in FIG. 10).

The distance from the second plane P2 to the second n-type region 38 (d9 in FIG. 10) is shorter than, for example, the distance from the second plane P2 to the first n-type region 34 (d8 in FIG. 10). In other words, the depth of the second n-type region 38 is smaller than, for example, the depth of the first n-type region 34.

Next, an example of a method for manufacturing the semiconductor device of the second embodiment will be described.

Figure 11:
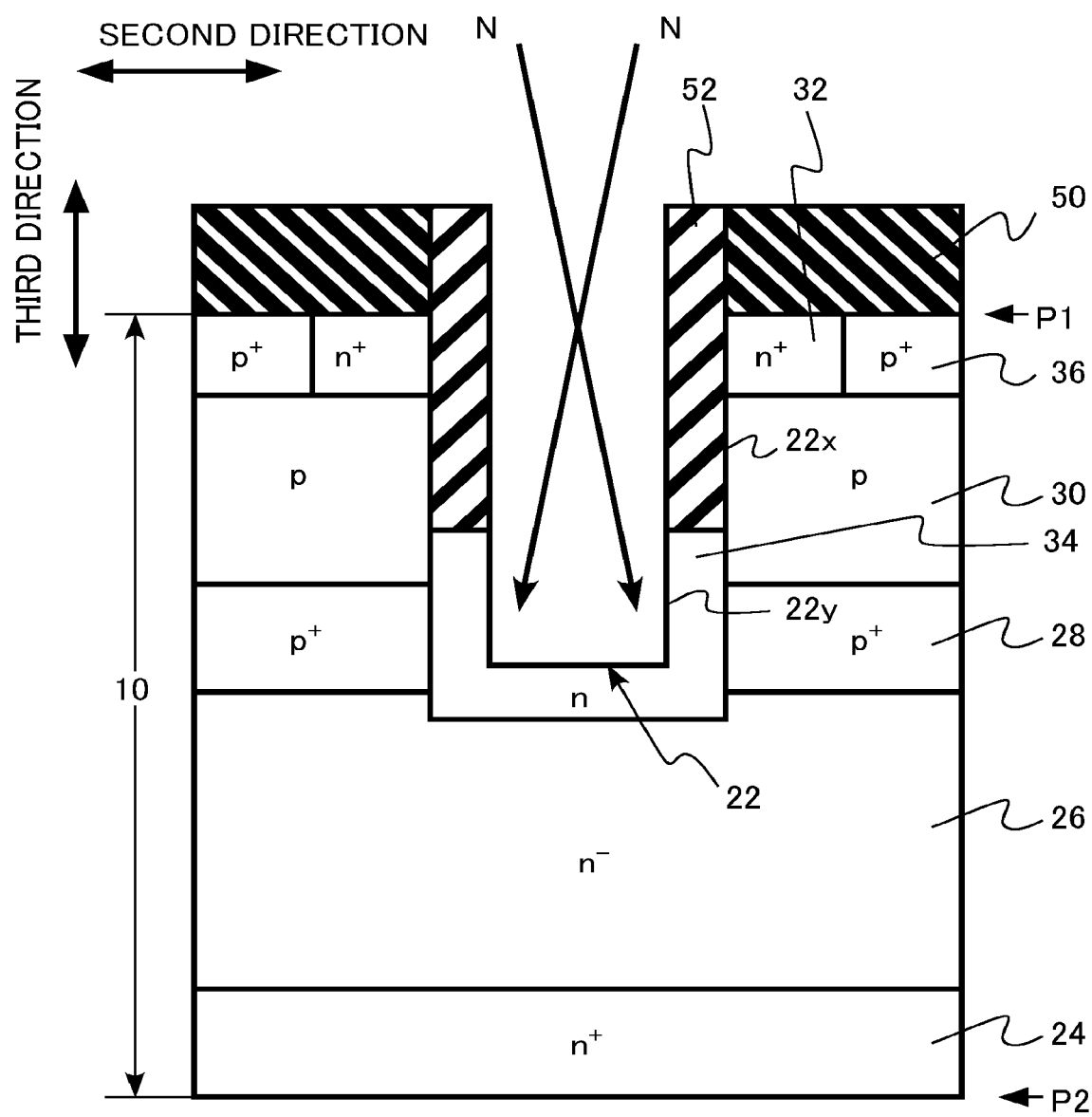
FIG. 11 is a schematic sectional view illustrating an example of a method for manufacturing the semiconductor device according to the second embodiment.
Figure 12:
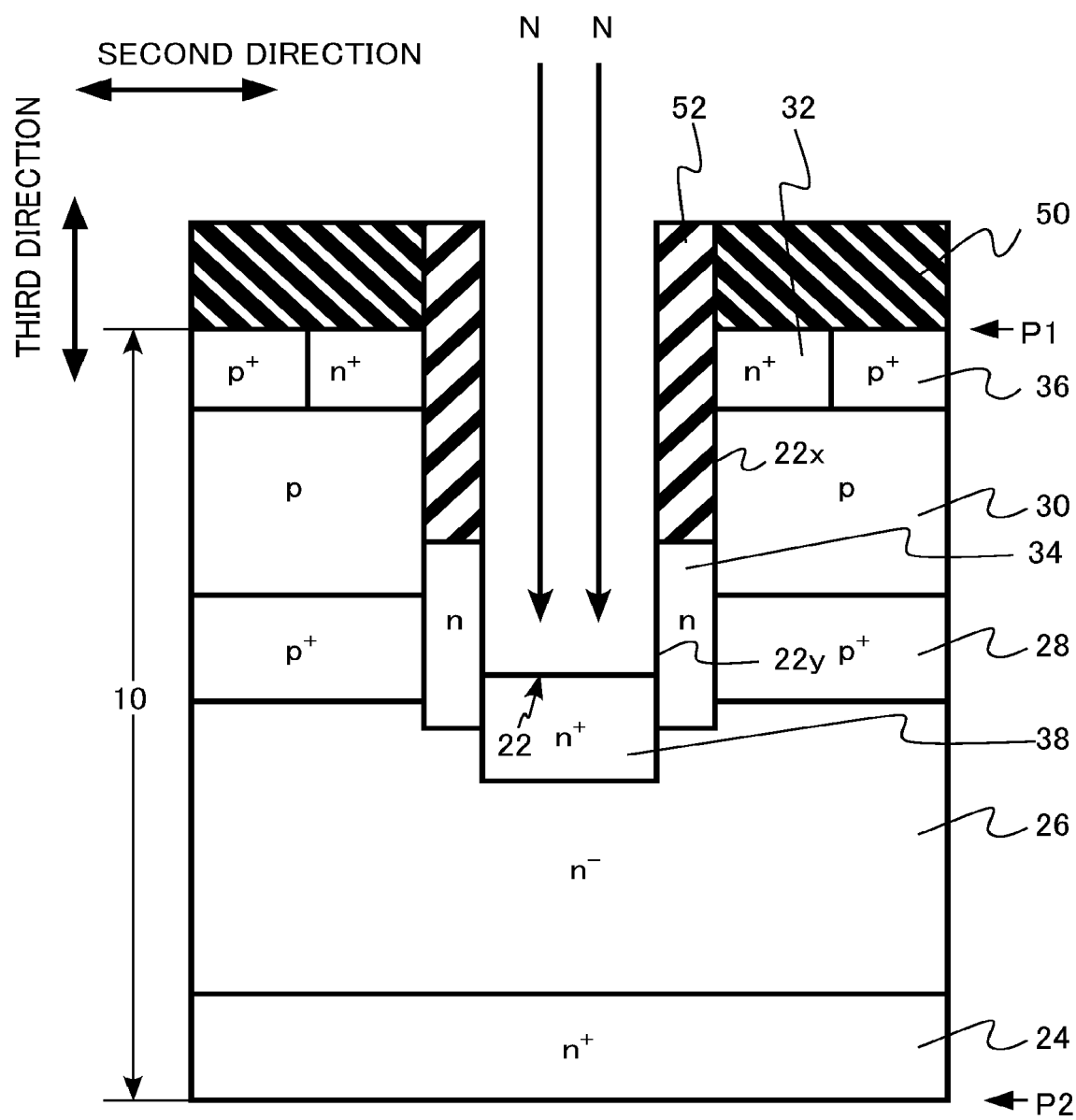
FIG. 12 is a schematic sectional view illustrating an example of the method for manufacturing the semiconductor device according to the second embodiment.
Figure 13:
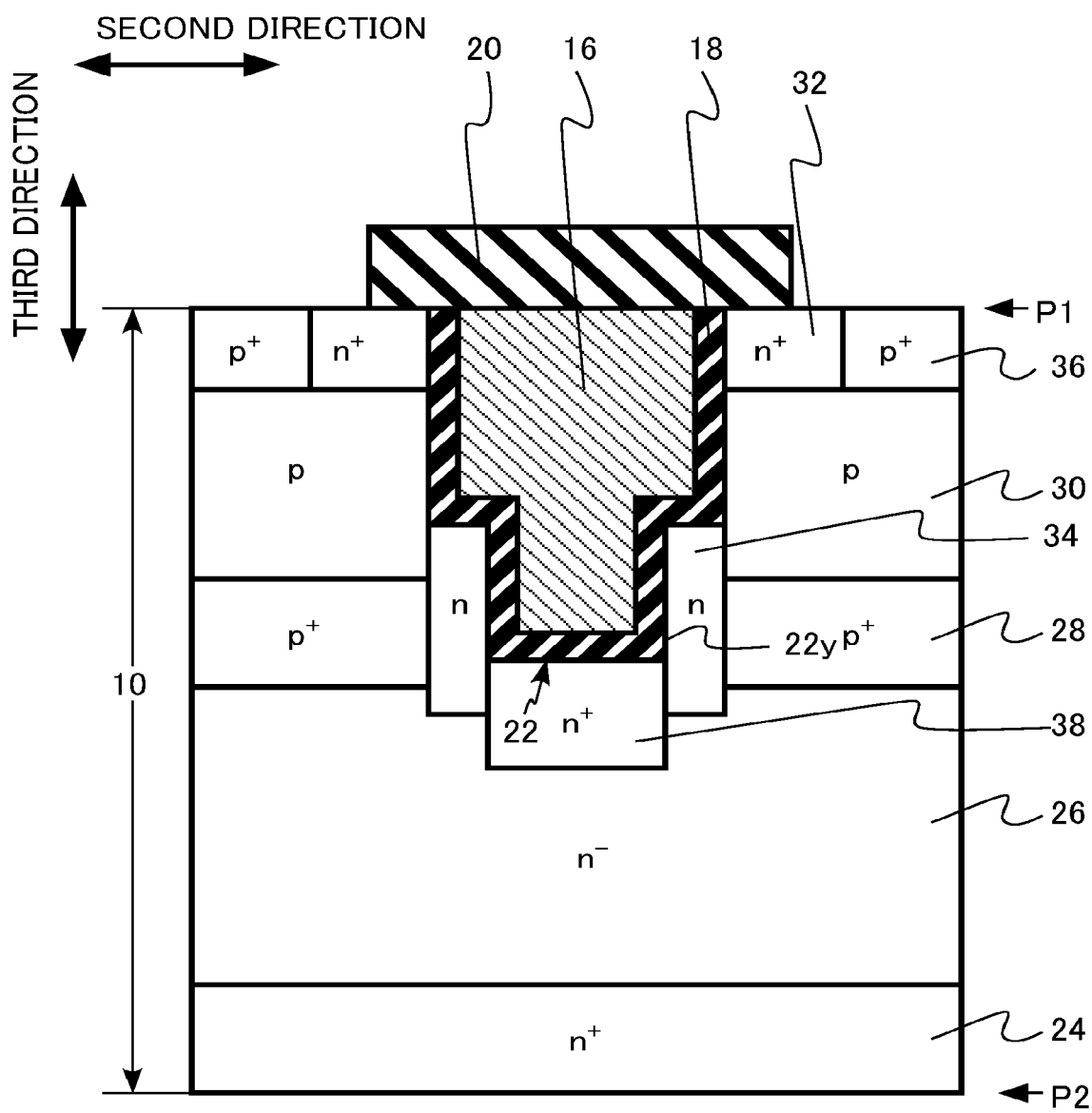
FIG. 13 is a schematic sectional view illustrating an example of the method for manufacturing the semiconductor device according to the second embodiment.

FIG. 11, FIG. 12, and FIG. 13 are schematic sectional views illustrating an example of a method for manufacturing the semiconductor device according to the second embodiment. FIG. 11, FIG. 12, and FIG. 13 illustrate cross sections corresponding to FIG. 10.

The method is the same as the method for manufacturing the semiconductor device of the first embodiment until n-type impurities are implanted using an oblique ion implantation method, with the mask material 50 and the sidewall insulating film 52 as a mask, to form a first n-type region 34 (FIG. 11).

Next, n-type impurities are implanted using an ion implantation method, with the mask material 50 and the sidewall insulating film 52 as a mask, to form a second re-type region 38 (FIG. 12). The n-type impurities are implanted on an ion implantation condition of being nearly perpendicular to the first plane P1. The n-type impurities are, for example, nitrogen (N).

The second n-type region 38 is formed on the bottom surface of the second portion 22y of the trench 22.

Next, the mask material 50 and the sidewall insulating film 52 are removed by, for example, a known wet etching method.

Subsequently, the gate insulating layer 18 and the gate electrode 16 are formed in the trench 22 by using a known process technique. Further, an interlayer insulating layer 20 is formed on the gate electrode 16 by using a known process technique (FIG. 13).

Thereafter, the source electrode 12 and the drain electrode 14 are formed using a known process technique. The MOSFET 200 illustrated in FIG. 10 is manufactured by the above manufacturing method.

The MOSFET 200 has the second n-type region 38 having an n-type impurity concentration higher than that of first n-type region 34, so that the resistance of the path from the channel formed in the body region 30 to the drift region 26 is reduced. Therefore, the on-resistance of the MOSFET 200 is reduced.

As described above, according to the second embodiment, it is possible to achieve a MOSFET capable of improving the reliability of the gate insulating layer and reducing the on-resistance.

Third Embodiment

An inverter circuit and a drive device of a third embodiment are drive devices including the semiconductor device of the first embodiment.

Figure 14:
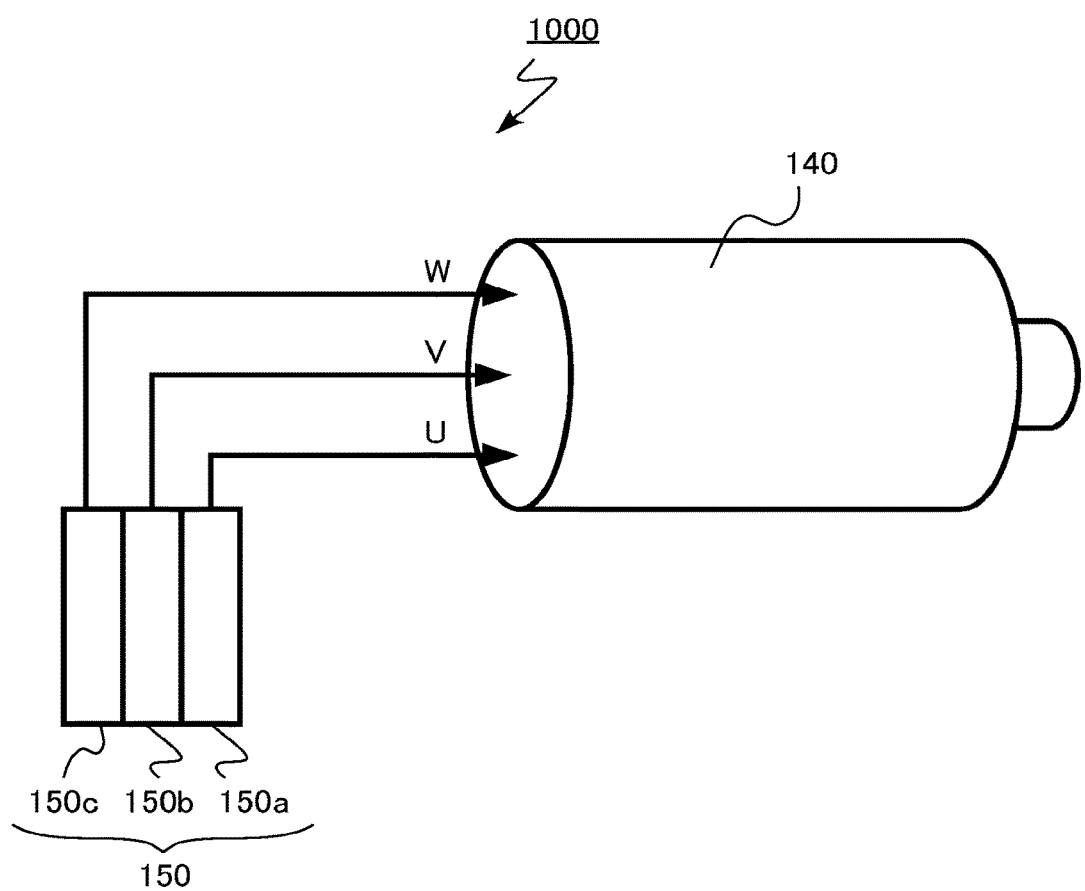
FIG. 14 is a schematic diagram of a drive device according to a third embodiment.

FIG. 14 is a schematic diagram of the drive device according to the third embodiment. A drive device 1000 includes a motor 140 and an inverter circuit 150.

The inverter circuit 150 is made up of three semiconductor modules 150a, 150b, 150c using the MOSFET 100 of the first embodiment as a switching element. By connecting the three semiconductor modules 150a, 150b, 150c in parallel, the three-phase inverter circuit 150 including three AC voltage output terminals U, V, W is achieved. The motor 140 is driven by the AC voltage output from the inverter circuit 150.

According to the third embodiment, the inverter circuit 150 and the drive device 1000 have improved characteristics by including the MOSFET 100 with improved characteristics.

Fourth Embodiment

A vehicle of a fourth embodiment is a vehicle including the semiconductor device of the first embodiment.

Figure 15:
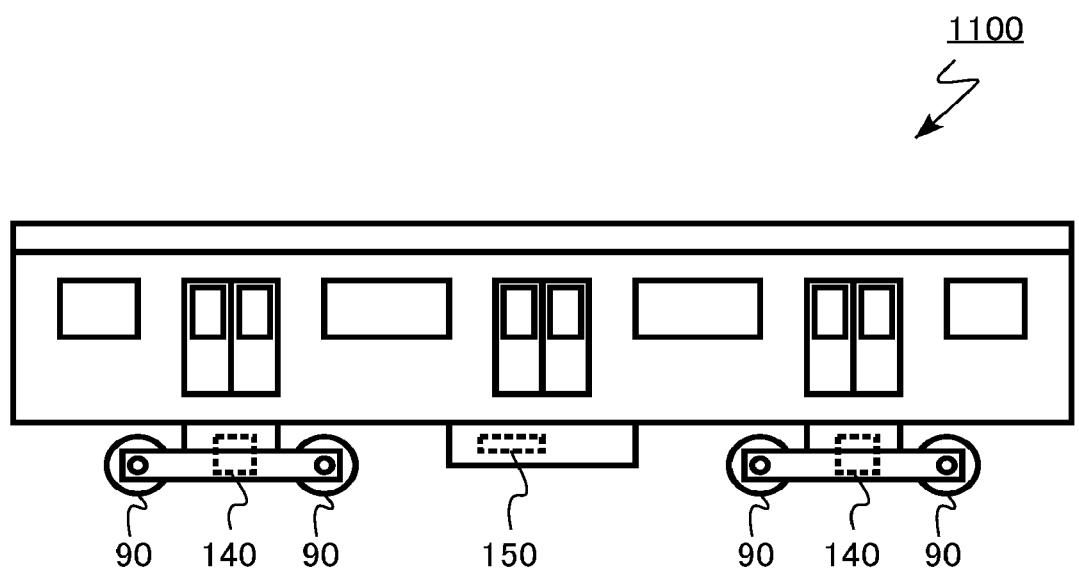
FIG. 15 is a schematic diagram of a vehicle according to a fourth embodiment.

FIG. 15 is a schematic diagram of a vehicle according to the fourth embodiment. A vehicle 1100 of the fourth embodiment is a railway vehicle. The vehicle 1100 includes a motor 140 and an inverter circuit 150.

The inverter circuit 150 is made up of three semiconductor modules using the MOSFET 100 of the first embodiment as a switching element. By connecting the three semiconductor modules in parallel, the three-phase inverter circuit 150 including three AC voltage output terminals U, V, W is achieved. The motor 140 is driven by the AC voltage output from the inverter circuit 150. Wheels 90 of the vehicle 1100 are rotated by the motor 140.

According to the fourth embodiment, the vehicle 1100 has improved characteristics by including the MOSFET 100 with improved characteristics.

Fifth Embodiment

A vehicle of a fifth embodiment is a vehicle including the semiconductor device of the first embodiment.

Figure 16:
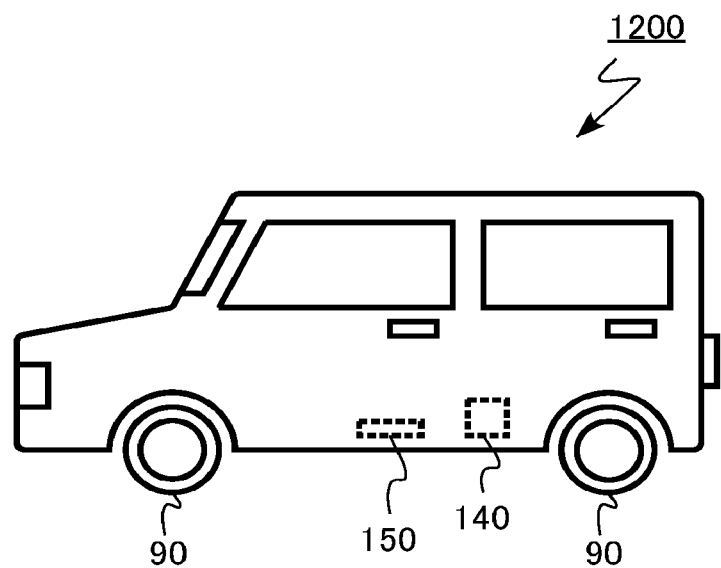
FIG. 16 is a schematic diagram of a vehicle according to a fifth embodiment.

FIG. 16 is a schematic diagram of a vehicle according to the fifth embodiment. A vehicle 1200 of the fifth embodiment is an automobile. The vehicle 1200 includes a motor 140 and an inverter circuit 150.

The inverter circuit 150 is made up of three semiconductor modules using the MOSFET 100 of the first embodiment as a switching element. By connecting the three semiconductor modules in parallel, the three-phase inverter circuit 150 including three AC voltage output terminals U, V, W is achieved.

The motor 140 is driven by the AC voltage output from the inverter circuit 150. Wheels 90 of the vehicle 1200 are rotated by the motor 140.

According to the fifth embodiment, the vehicle 1200 has improved characteristics by including the MOSFET 100 with improved characteristics.

Sixth Embodiment

An elevator of a sixth embodiment is an elevator including the semiconductor device of the first embodiment.

Figure 17:
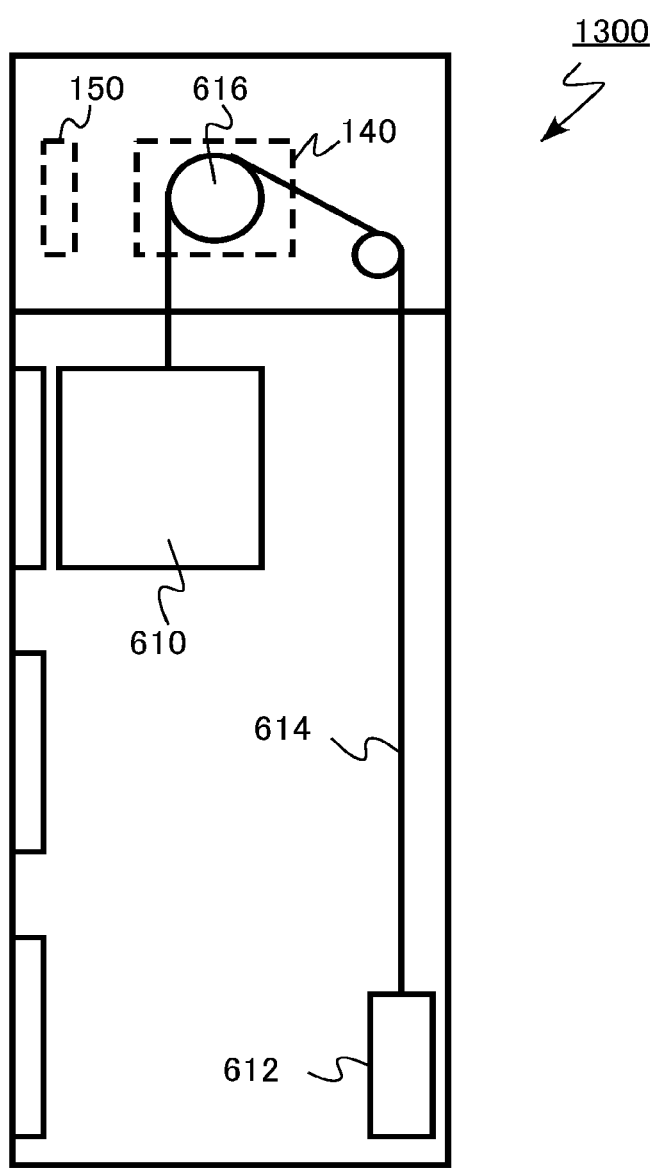
FIG. 17 is a schematic diagram of an elevator according to a sixth embodiment.

FIG. 17 is a schematic diagram of an elevator according to a sixth embodiment. The elevator 1300 of the sixth embodiment includes a car 610, a counterweight 612, a wire rope 614, a hoist 616, a motor 140, and an inverter circuit 150.

The inverter circuit 150 is made up of three semiconductor modules using the MOSFET 100 of the first embodiment as a switching element. By connecting the three semiconductor modules in parallel, the three-phase inverter circuit 150 including three AC voltage output terminals U, V, W is achieved.

The motor 140 is driven by the AC voltage output from the inverter circuit 150. The hoist 616 is rotated by the motor 140, and the car 610 is moved up and down.

According to the sixth embodiment, the elevator 1300 has improved characteristics by including the MOSFET 100 with improved characteristics.

As described above, in the first or second embodiment, the case where 4H—SiC is used as the crystal structure of the silicon carbide has been described as an example. However, the present disclosure is also applicable to silicon carbide having other crystal structures such as 6H—SiC and 3C—SiC.

In the third to sixth embodiments, the case where the semiconductor device of the first embodiment is provided has been described as an example. However, the semiconductor device of the second embodiment can is also applicable.

Further, in the third to sixth embodiments, the case where the semiconductor device of the present disclosure is applied to a vehicle or an elevator has been described as an example. However, the semiconductor device of the present disclosure can is also applicable to, for example, a power conditioner of a photovoltaic system.

While certain embodiments have been described, these embodiments have been presented by way of example only, and are not intended to limit the scope of the inventions. Indeed, the semiconductor device, the inverter circuit, the drive device, a vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first electrode;
   a second electrode;
   a silicon carbide layer located between the first electrode and the second electrode, the silicon carbide layer having a first plane parallel to a first direction and a second direction intersecting the first direction, and a second plane parallel to the first direction and the second direction, the second plane facing the first plane, the silicon carbide layer including
- a trench located on a first plane side, the trench extending in the first direction on the first plane, the trench having a first portion and a second portion closer to the second plane than the first portion, the second portion having a width in the second direction smaller than a width of the first portion in the second direction,
- a first silicon carbide region of n-type,
- a second silicon carbide region of p-type located between the first silicon carbide region and the first plane,
- a third silicon carbide region of p-type located between the second silicon carbide region and the first plane, the third silicon carbide region having a p-type impurity concentration lower than a p-type impurity concentration of the second silicon carbide region,
- an fourth silicon carbide region of n-type located between the third silicon carbide region and the first plane, and
- an fifth silicon carbide region of n-type located between the second portion and the second silicon carbide region, the fifth silicon carbide region having an n-type impurity concentration higher than an n-type impurity concentration of the first silicon carbide region;
- a gate electrode located in the trench; and
- a gate insulating layer located between the gate electrode and the silicon carbide layer,
- wherein the fifth silicon carbide region is in physical contact with the first silicon carbide region on a line extending in a third direction perpendicular to the first direction and the second direction from the second portion to the second plane.

2. The semiconductor device according to claim 1, wherein a p-type impurity concentration of the fifth silicon carbide region is higher than a p-type impurity concentration of the first silicon carbide region.

3. The semiconductor device according to claim 2, wherein the fifth silicon carbide region has an n-type impurity concentration and a p-type impurity concentration of $1 \times 10^{18}$ cm$^{-3}$ or more.

4. The semiconductor device according to claim 1, wherein a thickness of the fifth silicon carbide region in the second direction is 0.01 μm or more and 0.2 μm or less.

5. The semiconductor device according to claim 1, wherein a p-type impurity concentration of the second silicon carbide region is 10 or more times a p-type impurity concentration of the third silicon carbide region.

6. The semiconductor device according to claim 1, wherein a distance from the second plane to the trench is shorter than a distance from the second plane to the third silicon carbide region.

7. The semiconductor device according to claim 1, wherein a distance from the second plane to the trench is longer than a distance from the second plane to the second silicon carbide region.

8. The semiconductor device according to claim 1, wherein a distance from the second plane to the first portion is longer than a distance from the second plane to the third silicon carbide region, and the distance from the second plane to the first portion is shorter than a distance from the second plane to the fourth silicon carbide region.

9. The semiconductor device according to claim 1, wherein a distance from the first plane to the fifth silicon carbide region is shorter than a distance from the first plane to the second silicon carbide region.

10. The semiconductor device according to claim 1, wherein a shortest distance from the second plane to the fifth silicon carbide region is shorter than a shortest distance from the second plane to the second silicon carbide region.

11. The semiconductor device according to claim 1, wherein the silicon carbide layer further includes a sixth silicon carbide region located between the trench and the first silicon carbide region, the sixth silicon carbide region having an n-type impurity concentration higher than an n-type impurity concentration of the fifth silicon carbide region.

12. The semiconductor device according to claim 11, wherein a distance from the second plane to the sixth silicon carbide region is shorter than a distance from the second plane to the fifth silicon carbide region.

13. The semiconductor device according to claim 11, wherein a width of the sixth silicon carbide region in the second direction is smaller than a width of the fifth silicon carbide region in the second direction.

14. The semiconductor device according to claim 1, wherein the silicon carbide layer further includes a seventh silicon carbide region located between the third silicon carbide region and the first plane, the seventh silicon carbide region having a p-type impurity concentration higher than a p-type impurity concentration of the third silicon carbide region.

15. The semiconductor device according to claim 14, wherein the seventh silicon carbide region is repeatedly disposed on the first plane in the first direction with the fourth silicon carbide region interposed between the seventh silicon carbide regions.

16. An inverter circuit comprising the semiconductor device according to claim 1.

17. A drive device comprising the semiconductor device according to claim 1.

18. A vehicle comprising the semiconductor device according to claim 1.

19. An elevator comprising the semiconductor device according to claim 1.

20. A semiconductor device comprising:
- a first electrode;
- a second electrode;
- a silicon carbide layer located between the first electrode and the second electrode, the silicon carbide layer having a first plane parallel to a first direction and a second direction intersecting the first direction, and a second plane parallel to the first direction and the second direction, the second plane facing the first plane, the silicon carbide layer including
  - a trench located on a first plane side, the trench extending in the first direction on the first plane, the trench having a first portion and a second portion closer to the second plane than the first portion, the second portion having a width in the second direction smaller than a width of the first portion in the second direction,
  - a first silicon carbide region of n-type,
  - a second silicon carbide region of p-type located between the first silicon carbide region and the first plane,
  - a third silicon carbide region of p-type located between the second silicon carbide region and the first plane, the third silicon carbide region having a p-type impurity concentration lower than a p-type impurity concentration of the second silicon carbide region, an fourth silicon carbide region of n-type located between the third silicon carbide region and the first plane, and an fifth silicon carbide region of n-type located between the second portion and the second silicon carbide region, the fifth silicon carbide region having an n-type impurity concentration higher than an n-type impurity concentration of the first silicon carbide region;

a gate electrode located in the trench; and a gate insulating layer located between the gate electrode and the silicon carbide layer, wherein a shortest distance from the second plane to the fifth silicon carbide region is shorter than a shortest distance from the second plane to the second silicon carbide region.

* * * * *